United States Patent [19]
Kim

[11] Patent Number: 6,107,662
[45] Date of Patent: Aug. 22, 2000

[54] THIN FILM TRANSISTOR AND METHOD FOR FABRICATING THE SAME

[75] Inventor: Byung-Kook Kim, Daejeon-si, Rep. of Korea

[73] Assignee: LG Semicon Co., Ltd., Cheongju-Si, Rep. of Korea

[21] Appl. No.: 09/053,022

[22] Filed: Apr. 1, 1998

[30] Foreign Application Priority Data

Aug. 14, 1997 [KR] Rep. of Korea ....................... 97-38881

[51] Int. Cl.⁷ .................................................. H01L 29/72
[52] U.S. Cl. ......................... 257/330; 257/332; 257/347; 257/401; 438/149; 438/230; 438/270
[58] Field of Search ................................... 438/151, 149, 438/230, 270; 257/330, 332, 347, 401

[56] References Cited

U.S. PATENT DOCUMENTS

| | | | |
|---|---|---|---|
| 5,298,780 | 3/1994 | Harada | 257/330 |
| 5,334,862 | 8/1994 | Manning et al. | 257/67 |
| 5,617,502 | 4/1997 | Ort et al. | 386/97 |
| 5,736,435 | 4/1998 | Venkatesan et al. | 438/151 |
| 5,763,285 | 6/1998 | Yang | 437/44 |
| 5,780,325 | 7/1998 | Lee | 438/149 |

FOREIGN PATENT DOCUMENTS

| | | |
|---|---|---|
| 0 648 056 A2 | 4/1995 | European Pat. Off. . |
| 2 319 920A | 6/1998 | United Kingdom . |

OTHER PUBLICATIONS

Hayden, J.D., Cooper, K.J., Roth, S.S., Kirsch, H.C., "A New Technical Toridal TFT Structure for Future Generation SRAMs," International Electron Devices Meeting Technical Digest, Dec., 1993.

*Primary Examiner*—Edward Wojciechowicz
*Attorney, Agent, or Firm*—Fleshner & Kim, LLP

[57] ABSTRACT

A thin film transistor (TFT) and a method for fabricating the same utilize a sidewall spacer and a trench to improve the reliability of the device. The TFT includes a substrate, a trench formed in the substrate, and an active layer formed on the substrate and in the trench. A sidewall spacer is formed on the active layer along at least one side of the trench. A gate insulating film is formed over the sidewall spacer and the active layer. A gate electrode is formed on the gate insulating film in the trench. Source and drain electrodes are formed in the active layer or opposite sides of the gate electrode.

23 Claims, 6 Drawing Sheets

F I G.3
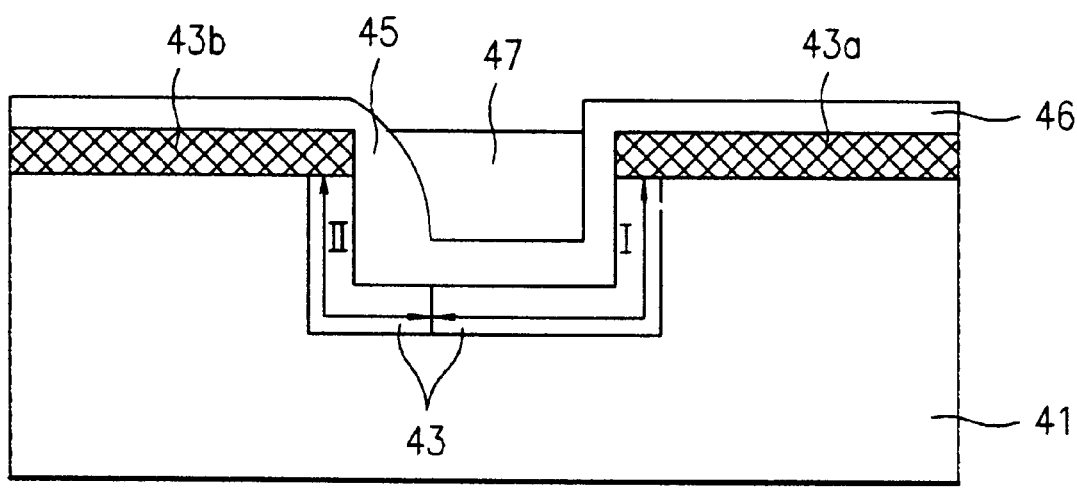

THIN FILM TRANSISTOR AND METHOD FOR FABRICATING THE SAME

BACKGROUND OF THE INVENTION

1. Field of the Invention

The present invention relates to a thin film transistor, and a method for fabricating the same.

2. Background of the Related Art

Instead of a CMOS load transistor or a load resistor, a thin film transistor (hereinafter referred to as a TFT) may be used in an SRAM cell of 4M or more. The TFT may serve as a switching device that switches image data signals of a pixel region in a liquid crystal display device. In particular, a PMOS TFT may be used in an SRAM cell to reduce off-current and to increase on-current in a load resistor. Accordingly, the power consumption is diminished and memory characteristics are enhanced, thereby providing a high quality SRAM cell.

In such an SRAM cell, the correct formation and placement of offset regions of the TFTs with respect to other elements of the TFTs are important to the stability of the SRAM cell. Thus, the offset region must not be deformed or mis-aligned during the formation process.

A related art TFT and a method for fabricating the same will be described with reference to FIG. 1, which is a cross-sectional view showing a structure of the related art TFT. The TFT includes an insulating layer 21, a gate electrode 22a formed on a predetermined portion of the insulating layer 21, and a gate insulating film 24 formed on the insulating layer 21 and the gate electrode 22a. A drain electrode 25b is formed on the gate insulating film 24, spaced apart from the gate electrode 22a. A source electrode 25a is formed on the gate insulating film 24 such that it overlaps the gate electrode 22a. A channel region I and an offset region II are formed on the gate insulating film 24 between the source and drain electrodes 25a and 25b. In this case, the offset region II is placed between the drain electrode 25b and the gate electrode 22a.

A method for fabricating the related art TFT will now be described with reference to FIGS. 2A to 2D, which are cross-sectional views showing fabrication process steps of the related art TFT. As shown in FIG. 2A, a first polysilicon layer 22 for formation of a gate electrode of the TFT is formed on an insulating layer 21. A photoresist film is coated on the first polysilicon layer 22 and patterned with an exposure and development process to form a mask pattern 23.

Referring to FIG. 2B, the first polysilicon layer 22 is selectively removed by an etching process using the mask pattern 23, thereby forming a gate electrode 22a. A gate insulating film 24 is then deposited on the insulating layer 21 and the gate electrode 22a. Subsequently, a second polysilicon layer 25, which will be used as a source electrode, a drain electrode, an offset region, and a channel region, is formed on the gate insulating film 24. Next, a photoresist film 26 is coated on the second polysilicon layer 25.

Referring to FIG. 2C, the photoresist film 26 is patterned with an exposure and development process to mask the portion of the second polysilicon layer 25 that will become the channel and offset regions. With the photoresist pattern 26 serving as a mask, impurity ions are implanted in the exposed portions of the second polysilicon layer 25, thereby forming a source electrode 25a and a drain electrode 25b. Thereafter, the photoresist film 26 is removed. The source electrode 25a partially overlaps the gate electrode 22a, and the drain electrode 25b is spaced apart from the gate electrode 22a by a predetermined distance. A channel region I and an offset region II are formed between the source electrode 25a and the drain electrode 25b.

The related art TFT has several problems. First, processes using photoresist marks are necessary to form the offset and channel regions, the source electrode, and the drain electrode. The process used to create the photoresist masks can result in improper formation of the channel and offset regions due to misalignment of the photoresist. When this occurs, the reliability of a semiconductor device incorporating the TFT Is deteriorated. When this occurs during formation of an SRAM device, the stability of the cell can become negatively affected.

SUMMARY OF THE INVENTION

The present invention is directed to a TFT and a fabricating method thereof that substantially obviates one or more of the problems inherent in the related art TFTs. It is an object of the invention to provide a TFT and a method for fabricating the same in which no masks are necessary to form the offset and channel regions, the source electrode or the drain electrode. Instead, a self-alignment method is used, thus improving the reliability of the TFT and simplifying its overall fabrication process.

To achieve these and other advantages, a TFT embodying the invention includes a substrate, a trench, an active layer formed on the substrate and in the trench, and a sidewall spacer formed on the active layer along at least one side of the trench. A gate insulating film is formed on the sidewall spacer and on the active layer. A gate electrode is formed on the gate insulating film in the trench. Source and drain electrodes are formed in the active layer on opposite sides of the gate electrode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawing figures in which like reference numerals refer to like elements, and wherein:

FIG. 3 is a cross-sectional view showing the structure of a TFT embodying the present invention.

DETAILED DESCRIPTION OF PREFERRED EMBODIMENTS

Figure 1:
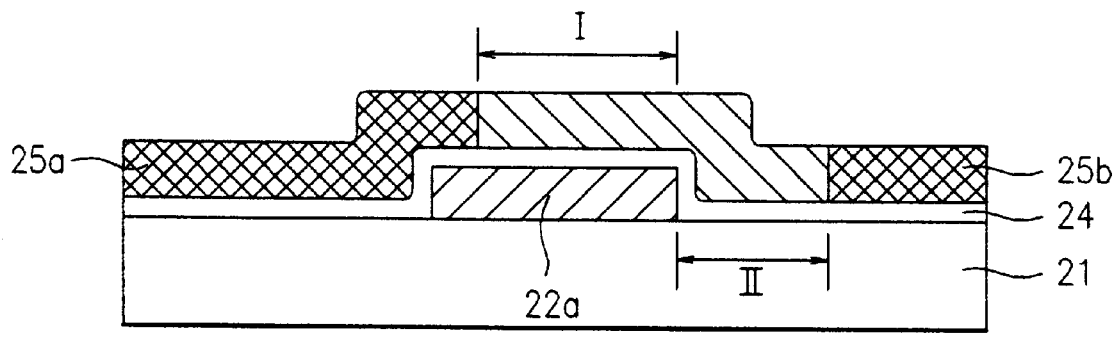
FIG. 1 is a cross-sectional view showing the structure of a related art TFT.
Figure 2A:
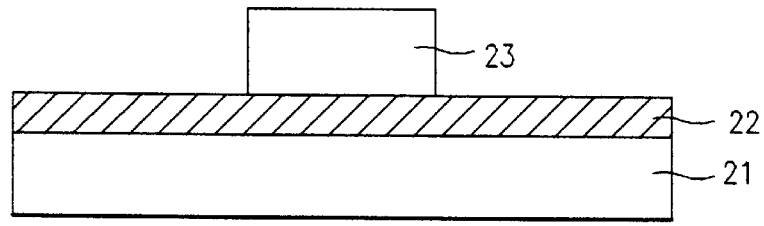
FIGS. 2A, 2B, 2C and 2D are cross-sectional views showing fabrication process steps of a related art TFT.
Figure 2B:
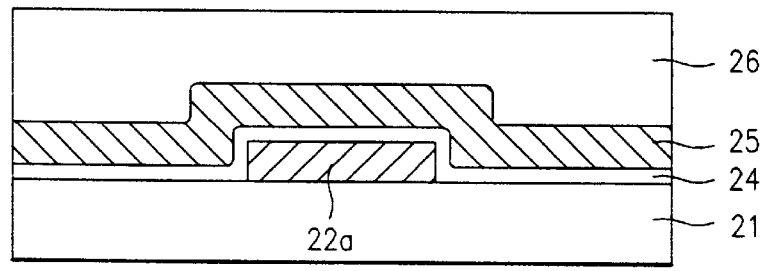
Figure 2C:
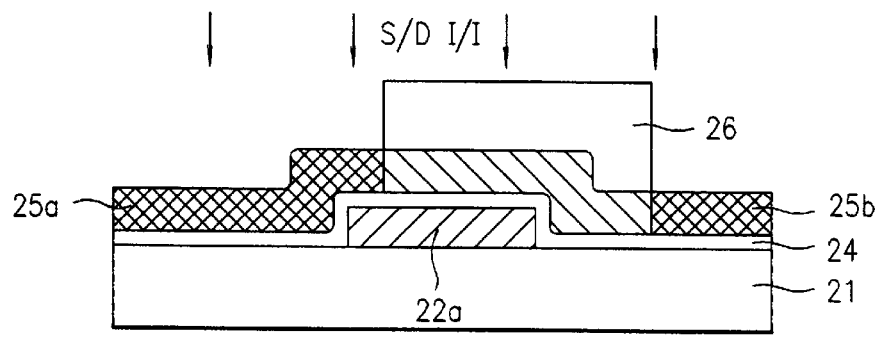
Figure 2D:
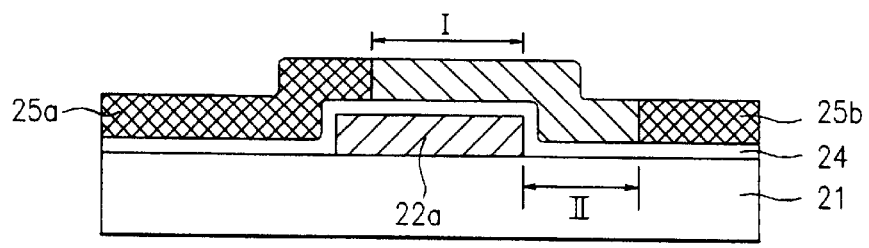

FIG. 3 is a cross-sectional view showing the structure of a TFT embodying the invention. The TFT includes an insulating substrate 41, a trench formed in the substrate 41, and an active layer 43 formed on the substrate 41 and in the trench. A sidewall spacer 45 is formed on the active layer 43 on at least one side of the trench. A gate insulating film 46 is formed on the active layer 43 and on the sidewall spacer

45. A gate electrode 47 is formed on the gate insulating film 46 in the trench. Source and drain electrodes 43a and 43b are formed in the active layer 43 on opposite sides of the gate electrode 47.

Figure 4A:
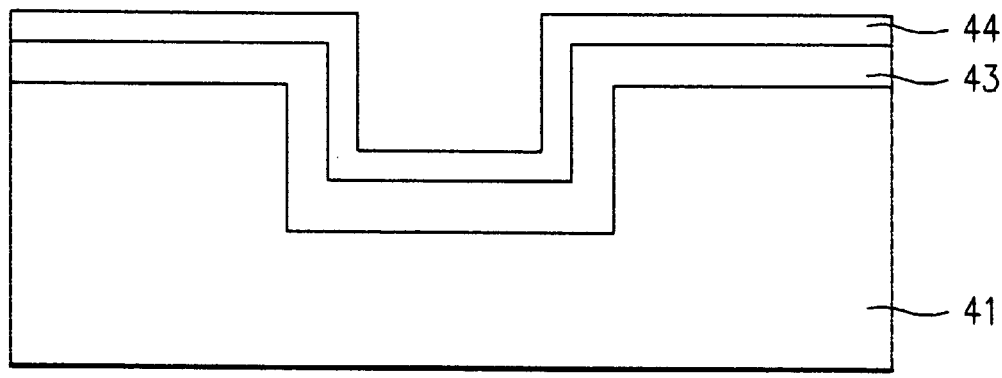
FIGS. 4A, 4B, 4C, 4D, 4E and 4F are cross-sectional views showing fabrication process steps of a method for fabricating a TFT embodying the present invention.

A method for fabricating the above-described TFT will now be described with reference to FIGS. 4A–4F. Referring initially to FIG. 4A, a trench is formed in a predetermined area of an insulating substrate 41. In an alternative embodiment, an insulating layer may first be formed on a substrate, and a trench may then be formed in the insulating layer. That is, after forming an insulating layer on a substrate 41, a photoresist film, which is not shown in the drawing, is coated on the insulating layer. The photoresist film would be patterned with an exposure and development process. With the photoresist pattern serving as a mask, the insulating layer would be etched to a predetermined depth to form a trench.

Subsequently, an active layer 43, which may be a semiconductor layer including polysilicon, is formed on the trench and the substrate. This active layer 43 will be used to form an offset region, a channel region, a source electrode and a drain electrode.

Figure 4B:
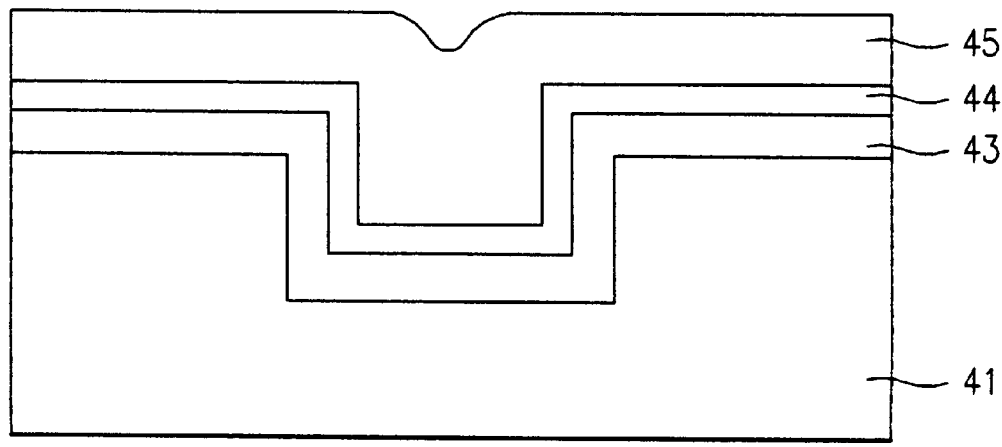

Next, the a first insulating layer 44 is formed on the active layer 43. An ion-implanting process for adjustment of threshold voltage $V_T$ is performed. As shown in FIG. 4B, a thick second insulating layer 45 is then formed on the first insulating layer 44. The selective etch ratio of the first and second insulating layers 44 and 45 should be very large. For example, the first and second insulating layers 44 and 45 may be a silicon oxide film and a silicon nitride film, respectively, or vice versa.

Figure 4C:
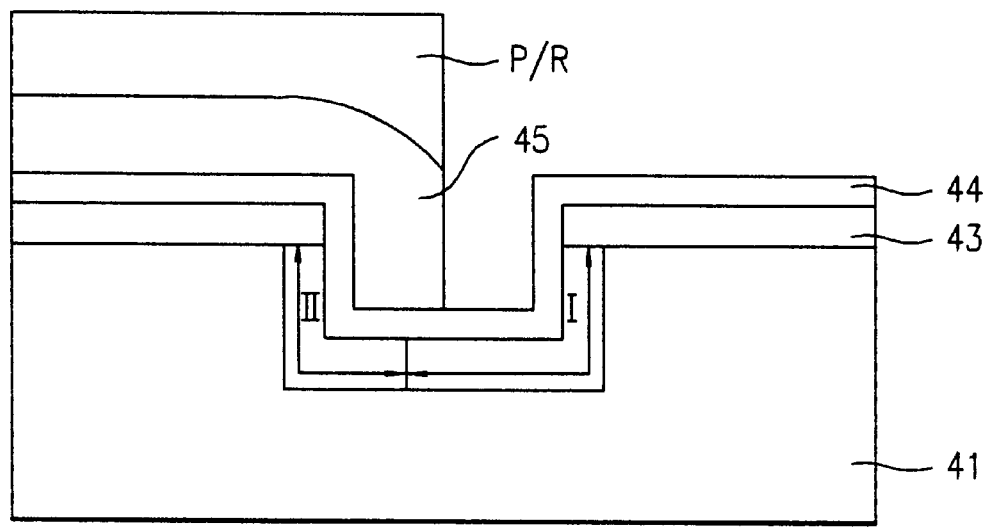

Referring to FIG. 4C, a photoresist film PR is then formed on the second insulating layer 45 and is patterned with an exposure and development process. With the photoresist pattern serving as a mask, the second insulting layer 45 is then selectively etched so that only the portions of the second insulating layer 45 overlying the intended placement of a sidewall spacer remain.

Figure 4D:
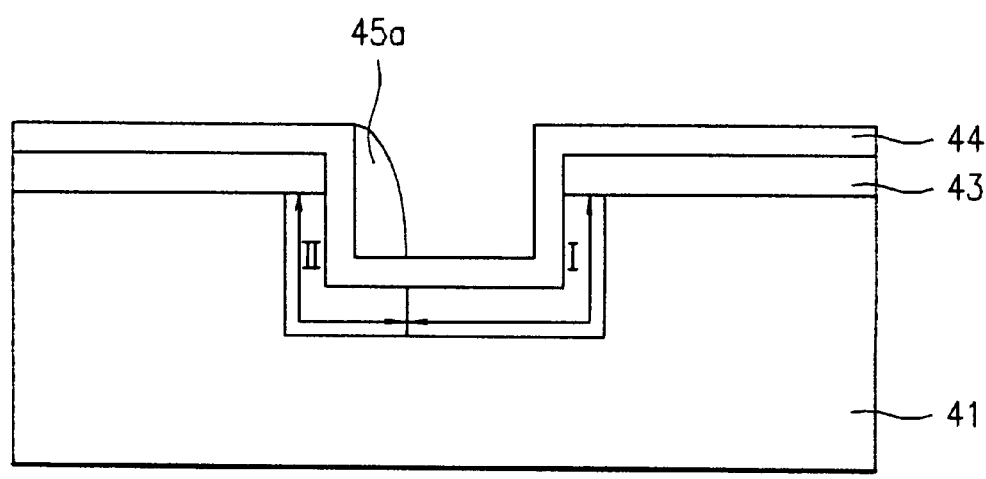

Referring to FIG. 4D, the remaining photoresist film Pr is then removed. Next, the second insulating layer 45 is etched to form a portion of a sidewall spacer 45a on the active layer 43 along one of the sides of the trench. Accordingly, the sidewall spacer includes a portion of the first insulating layer 44 and a portion of the second insulating layer 45 which was formed on the first insulating layer 44.

Alternatively, sidewall spacers can be formed on the active layer 43 on both sides of the trench. In order to form sidewall spacers on both sides of the trench, the second insulating film 45 is etched-back without the process of selectively removing the second insulating film 45 in a photo-etching process.

Figure 4E:
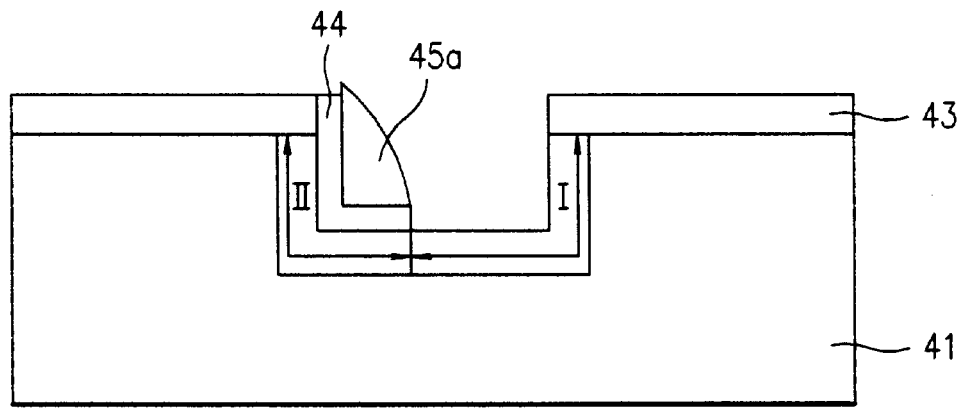

Referring to FIG. 4E, with the remaining portion of the second insulating layer 45a serving as a mask, the exposed portions of the first insulating layer 44 are removed in an etch process. In removing the first insulating layer 44, the sidewall spacer 45a is minimally etched due to the high selective etch ratio of the second insulating layer 45 and the first insulating layer 44.

Figure 4F:
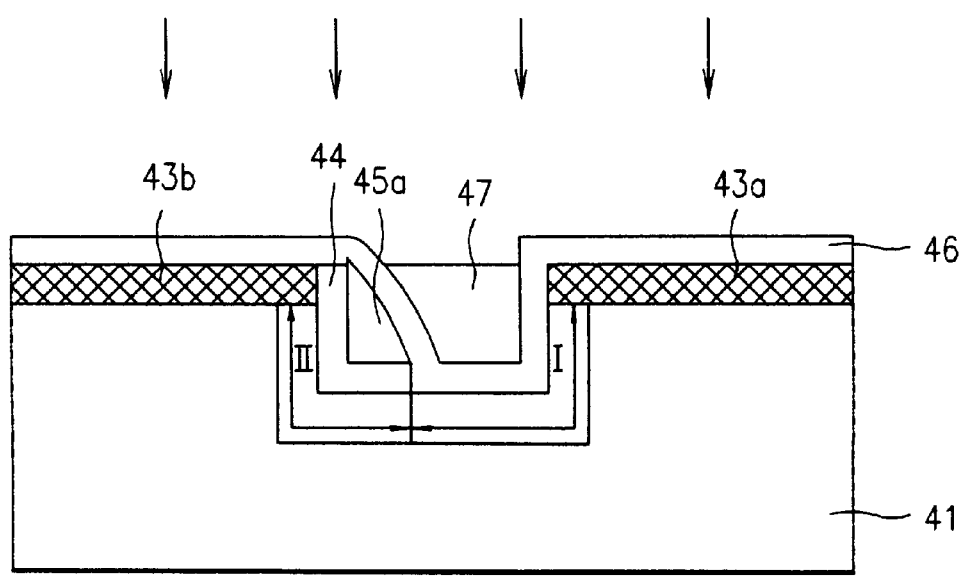

Referring to FIG. 4F, a gate insulating film 46 is then formed on the entire upper surface, including the sidewall spacer 45. Subsequently, a semiconductor layer for a gate electrode of the TFT is formed on the gate insulating film 46, and is then etched-back to form a gate electrode 47. Next, an ion-implanting process for forming source and drain electrodes is performed without a mask. Ions are not implanted into the portions of the active layer 43 underlying the sidewall spacer, because the sidewall spacer functions as a mask. Likewise, impurity ions are not implanted into the portions of the active layer 43 under the gate electrode 47, because the gate electrode functions as a mask. The portions of the active layer 43 masked by the sidewall spacer forms an offset region, while the remaining portions of the active layer 43 in the trench forms a channel region.

A TFT, and a method for fabricating the same that embody the present invention have several advantages over the related art TFTs. The method used to form source and drain electrodes and an offset region do not require masks, and are self-aligning. Thus, the offset region is not accidentally offset during the fabrication process. This improves the reliability of a semiconductor device utilizing the TFT. Further, an SRAM device utilizing the TFT has improved stability.

The foregoing embodiments are merely exemplary and are not to be construed as limiting the present invention. The present teaching can be readily applied to other types of devices. The description of the present invention is intended to be illustrative, and not to limit the scope of the claims. Many alternatives, modifications, and variations will be apparent to those skilled in the art.

What is claimed is:

1. A semiconductor device, comprising:

a substrate;

a recess;

an active layer formed on the substrate and in the recess;

a sidewall spacer formed on the active layer along at least one side of the recess;

a gate insulating layer formed on the sidewall spacer and the active layer;

a gate electrode formed on the gate insulating layer in the recess; and a source and a drain formed in the active layer.

2. The semiconductor device of claim 1, wherein the substrate is made of an insulating material.

3. The semiconductor device of claim 1, wherein the recess is formed in an insulating layer on the substrate.

4. The semiconductor device of claim 1, wherein the active layer further includes an offset region in a portion of the active layer corresponding to the sidewall spacer.

5. The semiconductor device of claim 4, wherein the offset region is formed along a side and a bottom of the recess.

6. The semiconductor device of claim 1, wherein the drain extends in a direction that is substantially perpendicular to a direction in which an adjoining portion of the offset region extends.

7. The semiconductor device of claim 1, further comprising a channel region formed in a portion of the active region corresponding to the gate electrode.

8. The semiconductor device of claim 1, wherein the active layer is a semiconductor layer.

9. The semiconductor device of claim 8, wherein the semiconductor layer is made of polysilicon.

10. The semiconductor device of claim 1, wherein the sidewall spacer includes a first insulating layer formed on a side and a bottom of the recess, and a second insulating layer formed on the first insulating layer.

11. The semiconductor device of claim 10, wherein the first and second insulating layers are an oxide layer and a nitride layer, respectively.

12. The semiconductor device of claim 10, wherein the first and second insulating layers are a nitride layer and an oxide layer, respectively.

13. A semiconductor device, comprising:

an insulating substrate;

a recess formed in the insulating substrate;

a semiconductor layer formed on an inner surface of the recess, wherein a source and a drain are formed in the semiconductor layer, and wherein a channel region is formed in a portion of the semiconductor layer along at least a bottom of the recess, and wherein an offset region is formed in a portion of the semiconductor layer along a side and bottom of the recess;

an insulative layer formed on the semiconductor layer; and a gate formed in the recess and on the insulative layer.

14. A method for fabricating a TFT on a substrate, comprising the steps of:

forming a recess;

forming an active layer on the substrate and in the recess;

forming a sidewall spacer on the active layer along at least one side of the recess;

forming a gate insulating layer on the active layer and the sidewall spacer;

forming a gate electrode on the gate insulating layer in the recess; and forming a source and a drain in the active layer.

15. The method as claimed in claim 14, wherein the step of forming the recess comprises the steps of:

forming an insulating layer on the substrate; and selectively etching the insulating layer to form a recess.

16. The method as claimed in claim 14, wherein the step of forming the sidewall spacer comprises the steps of:

forming a first insulating layer on the active layer;

forming a second insulating layer on the first insulating layer;

removing a first portion of the second insulating layer by etching in a first direction;

removing a second portion of the second insulating layer by etching so that a portion of the second insulating layer remains along at least one side of the recess; and removing portions of the first insulating layer by etching while using the remaining portion of the second insulating layer as a mask.

17. The method as claimed in claim 16, wherein the first insulating layer has a different selective etch ratio from that of the second insulating layer.

18. The method as claimed in claim 16, wherein the first and second insulating layers are made of an oxide and a nitride film, respectively, or vice versa.

19. The method as claimed in claim 14, wherein the source and drain are formed by an ion-implanting process using the sidewall spacer and the gate electrode as masks.

20. The method as claimed in claim 14, wherein the step of forming the active layer includes forming an offset region in a portion of the active layer corresponding to the sidewall spacer.

21. The semiconductor device of claim 13, further comprising at least one sidewall spacer formed on the semiconductor layer along at least one side of the recess.

22. The semiconductor device of claim 21, wherein the sidewall spacer includes a first insulating layer formed along a side and a bottom of the recess, and a second insulating layer formed on the first insulating layer.

23. The semiconductor device of claim 22, wherein the first and second insulating layers are an oxide layer and a nitride layer, respectively, or vice versa.

* * * * *